US009348745B2

(12) United States Patent
Suzuki

(10) Patent No.: US 9,348,745 B2
(45) Date of Patent: May 24, 2016

(54) SEMICONDUCTOR MEMORY STORAGE APPARATUS AND METHOD FOR STORING VARIABLE LENGTH FRAMES IN FIXED LENGTH PACKETS IN NONVOLATILE MEMORIES

(75) Inventor: Toshio Suzuki, Kawasaki (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 803 days.

(21) Appl. No.: 12/182,446

(22) Filed: Jul. 30, 2008

(65) Prior Publication Data

US 2009/0043950 A1 Feb. 12, 2009

(30) Foreign Application Priority Data

Aug. 7, 2007 (JP) ................................ 2007-205843

(51) Int. Cl.

| | |
|---|---|
| ***G06F 12/00*** | (2006.01) |
| ***G06F 13/00*** | (2006.01) |
| ***G06F 13/28*** | (2006.01) |
| ***G06F 12/02*** | (2006.01) |
| *G11C 11/00* | (2006.01) |

(52) U.S. Cl.

CPC .... *G06F 12/0246* (2013.01); *G06F 2212/1044* (2013.01); *G06F 2212/7207* (2013.01); *G11C 11/005* (2013.01)

(58) Field of Classification Search

USPC .......................................................... 711/103

See application file for complete search history.

(56) References Cited

U.S. PATENT DOCUMENTS

| | | | | |
|---|---|---|---|---|
| 5,991,503 | A * | 11/1999 | Miyasaka et al. | 386/329 |
| 6,704,310 | B1 * | 3/2004 | Zimmermann et al. | 370/389 |
| 2003/0053493 | A1 * | 3/2003 | Graham Mobley et al. | 370/538 |
| 2004/0080505 | A1 * | 4/2004 | Miyaji et al. | 345/418 |

(Continued)

FOREIGN PATENT DOCUMENTS

| | | |
|---|---|---|
| JP | 9-98430 | 4/1997 |
| JP | 2001-249695 | 9/2001 |

(Continued)

OTHER PUBLICATIONS

Japanese Patent Office Notification of Reasons for Rejection in Application No. 2007-205843 Mailed Jul. 17, 2009 (6 pages including translation).

(Continued)

*Primary Examiner* — Jared Rutz
*Assistant Examiner* — Marwan Ayash
(74) *Attorney, Agent, or Firm* — Finnegan, Henderson, Farabow, Garrett & Dunner, LLP

(57) ABSTRACT

A semiconductor memory storage apparatus includes a packetization unit receiving content data includes a plurality of variable-length frames, and adding management data showing frame data inherent information to frame data of each variable-length frame, and further, packetizing the content data storing the frame data and the management data in each fixed-length packet for every variable-length frame, a buffer temporarily storing the content data at a fixed-length packet unit in write/read operation of the content data packetized at the fixed-length packet unit, a storage unit using a non-volatile memory as an information storage medium, and storing the content data supplied from the buffer, and a controller writing/reading content data packetized at the fixed-length packet unit with respect to the storage unit at a fixed-length packet unit.

7 Claims, 2 Drawing Sheets

NOR semiconductor memory (small capacity)
42

NAND semiconductor memory (large capacity)
41

Packet [0]
Management data [0]
Frame data [0]

Packet [1]
Management data [1]
Frame data [1]

Packet [2]
Management data [2]
Frame data [2]

Packet [3]
Management data [3]
Frame data [3]

Packet [4]
Management data [4]
Frame data [4]

⋮

(56) References Cited

U.S. PATENT DOCUMENTS

| | | | | |
|---|---|---|---|---|
| 2006/0168400 | A1 * | 7/2006 | Ronciak et al. | 711/118 |
| 2007/0239928 | A1 * | 10/2007 | Gera et al. | 711/103 |
| 2007/0291836 | A1 * | 12/2007 | Shi et al. | 375/240.01 |

FOREIGN PATENT DOCUMENTS

| | | |
|---|---|---|
| JP | 2004-139725 | 5/2004 |
| JP | 2006-351089 | 12/2006 |
| KR | 2003-0035906 | 5/2003 |
| TW | 200703090 | 1/2007 |
| TW | 200730084 | 8/2007 |

OTHER PUBLICATIONS

Notification for Filing Opinion mailed on Aug. 10, 2010, in corresponding Korean Application No. 10-2008-0073993 (6 pages total).

Japanese Notification of the First Office Action in Corresponding Application No. 200810145004.3 Mailed Mar. 10, 2010 (16 pages total).

Taiwan Office Action in corresponding Application No. 097128872, mailed Jun. 19, 2012, 8 pages.

* cited by examiner

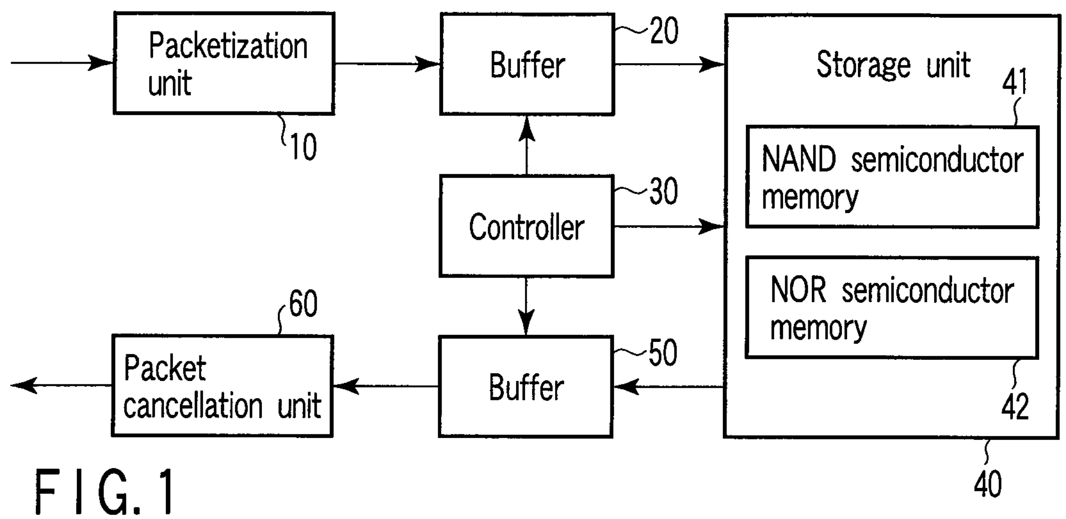
F I G. 1
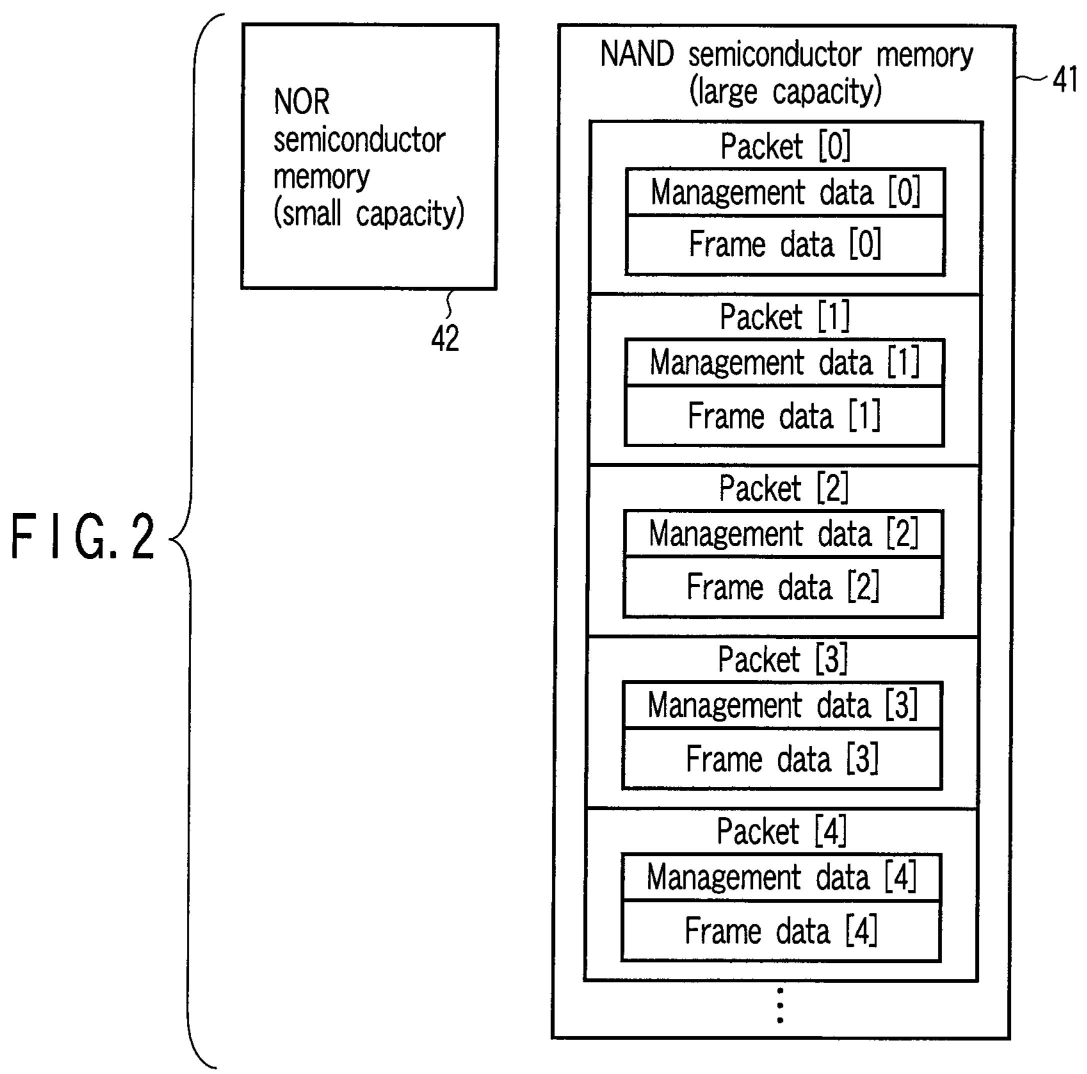
F I G. 2

SEMICONDUCTOR MEMORY STORAGE APPARATUS AND METHOD FOR STORING VARIABLE LENGTH FRAMES IN FIXED LENGTH PACKETS IN NONVOLATILE MEMORIES

CROSS-REFERENCE TO RELATED APPLICATIONS

This application is based upon and claims the benefit of priority from prior Japanese Patent Application No. 2007-205843, filed Aug. 7, 2007, the entire contents of which are incorporated herein by reference.

BACKGROUND OF THE INVENTION

1. Field of the Invention

The present invention relates to a semiconductor memory storage apparatus which stores content data in a semiconductor memory and a content data management method which manages content data in the semiconductor memory.

2. Description of the Related Art

A storage apparatus using a semiconductor memory as a recording medium has come into wide use for recording/reproducing information content such as content data. This is because such storage apparatuses enable multi-channel simultaneous multi-access and high-speed random access, for example. In particular, a semiconductor memory storage apparatus has high reliability because it does not include moving parts. Further, due to anticipated improvements in semiconductor processing, the storage capacity of semiconductor memories is expected to increase in the future.

A conventional semiconductor memory storage apparatus inputs content data comprising a plurality of variable-length frames. Thereafter, the apparatus stores frame data of the content data in a NAND semiconductor memory as variable-length data. Then, the apparatus further stores inherent information of the frame data and a storage position of every frame in a NOR semiconductor memory as management data.

Recently, the semiconductor process is improved; as a result, the NAND semiconductor memory has a large capacity, and therefore, can store a large amount of frame data. Further, it is easy to increase the capacity of the NAND semiconductor memory. But, it is difficult to increase the capacity of the NOR semiconductor memory. In this case, management data to be stored in the NOR semiconductor memory increases with the increase of the storage of the frame data in the NAND semiconductor memory. For this reason, there is a problem that a memory capacity for storing management data is insufficient with respect to a memory capacity for storing frame data.

The following method has been proposed (e.g., see Jpn. Pat. Appln. KOKAI publication No. 2006-351089). According to the foregoing method, input image data is continuously recorded to a storage medium in predetermined data units. This serves to reduce a non-use area of a storage medium generated by the difference between a fixed-length block size on the storage medium and coding data size. However, according to such method, image data is recorded in an image data area while management data is recorded in a management data area. For this reason, the image data area is required to have a large capacity; therefore, it is difficult to solve the foregoing problem that the memory capacity of the management data area is insufficient.

BRIEF SUMMARY OF THE INVENTION

An object of the present invention is to provide a semiconductor memory storage apparatus, which resolves the problem about resolves the problem related to limitations of the capacity for storing management data, and effectively manages a large amount of content data, and to provide a content data management method.

According to an aspect of the present invention, there is provided a semiconductor memory storage apparatus comprising: a packetization unit receiving content data comprising a plurality of variable-length frames, and adding management data showing frame data inherent information to frame data of each variable-length frame, and further, packetizing the content data storing the frame data and the management data in each fixed-length packet for every variable-length frame; a buffer temporarily storing the content data at a fixed-length packet unit in write/read operation of the content data packetized at the fixed-length packet unit; a storage unit using a non-volatile memory as an information storage medium, and storing the content data supplied from the buffer; and a controller writing/reading content data packetized at the fixed-length packet unit with respect to the storage unit at a fixed-length packet unit.

Additional objects and advantages of the invention will be set forth in the description which follows, and in part will be obvious from the description, or may be learned by practice of the invention. The objects and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing the configuration of a semiconductor memory storage apparatus according to one embodiment of the present invention;

FIG. 2 is a schematic view showing packetized audio data stored in a storage unit of FIG. 1;

DETAILED DESCRIPTION OF THE INVENTION

Figure 3:
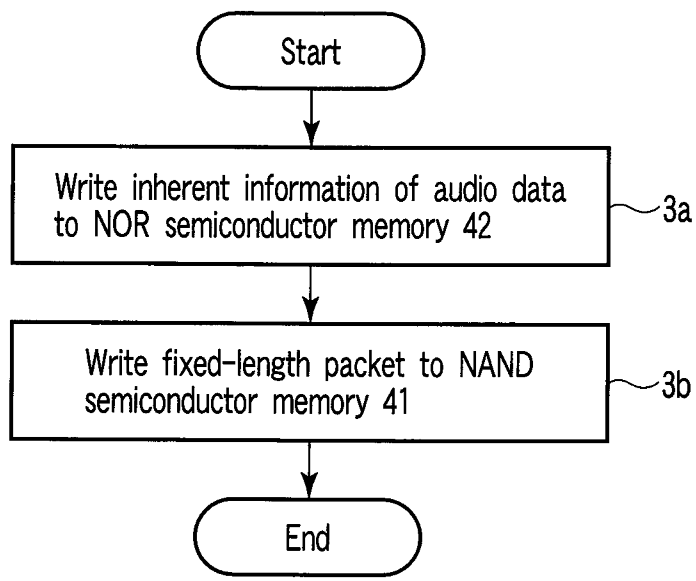
FIG. 3 is a flowchart to explain the procedure when a controller of FIG. 1 writes audio data in the storage unit.

An embodiment of the present invention will be hereinafter described with reference to the accompanying drawings.

FIG. 1 is a block diagram showing the configuration of a semiconductor memory storage apparatus according to one embodiment of the present invention. The semiconductor memory storage apparatus shown in FIG. 1 packetizes audio data comprising a plurality of variable-length frames using a packetization unit 10. Then, the semiconductor memory storage apparatus temporarily stores the packetized audio data in a buffer 20, and thereafter, writes the packetized audio data to a storage unit 40 according to write control of a controller 30. The apparatus reads the audio data stored in the storage unit 40 according to read control of the controller 30. Then, the apparatus temporarily stores the read audio data in a buffer 50, and thereafter, outputs the audio data after canceling packetization using a packet cancellation unit 60.

The foregoing packetization unit 10 receives audio data comprising a plurality of variable-length frames. Then, the unit 10 adds management data showing inherent information of frame data to frame data for every variable-length frame of the audio data. In this case, the inherent information is the data size of the frame data, frame number and additional information added by other devices. The unit 10 packetizes audio data storing the frame data and management data in a fixed-length packet.

FIG. 2 is a schematic view showing packetized audio data stored in a storage unit 40 according to one embodiment of the present invention. The storage unit 40 includes a NAND semiconductor memory 41 and a NOR semiconductor memory 42. The controller 30 writes a fixed-length packet stored with frame data and management data, which are output by the packetization unit 10, to the NAND semiconductor memory 41 in units of fixed-length packets. Thus, the following data are written to the NAND semiconductor memory 41. Specifically, the data are management data [0] and frame data [0] stored in a packet [0], management data [1] and frame data [1] stored in a packet [1], . . . . The controller 30 writes inherent information of the audio data, for example, the number of frames, to the NOR semiconductor memory 42.

The controller 30 reads the inherent information of the audio data from the NOR semiconductor memory 42. Thereafter, the controller 30 refers to the read inherent information to read the audio data stored in the NAND semiconductor memory 41 in units of fixed-length packets.

According to this embodiment, the capacity of the fixed-length packet is set to 8 kilobytes. The capacity of the frame data of the audio data is about 6 to 7 kilobytes, and the capacity of the management data is about 1 kilobyte. Therefore, even if frame data and management data are stored in the fixed-length packet, the data does not exceed the capacity of the fixed-length packet.

A Reed-Solomon correction code for compensating an error in a write/read operation is added to the tail of the fixed-length packet in packetization by the packetization unit 10.

The buffer 20 temporarily stores the packetized audio data output from the packetization unit 10 in units of fixed-length packets. The buffer 50 temporarily stores the packetized audio data read by the controller 30 in units of fixed-length packets.

The foregoing packet cancellation unit 60 receives the packetized audio data output from the buffer 50. Thereafter, the unit 60 cancels the packetization to output audio data as data comprising a plurality of variable-length frames.

The operational procedure of the controller 30 of the semiconductor memory storage apparatus having the foregoing configuration will be explained below. FIG. 3 is a flowchart to explain the procedure when the controller 30 according to one embodiment of the present invention writes audio data to the storage unit 40.

When the packetized audio data is output from the buffer 20, the controller 30 writes inherent information of the audio data to the NOR semiconductor memory 42 (block 3*a*). Thereafter, the controller 30 writes a fixed-length packet of the audio data to the NAND semiconductor memory 41 in units of fixed-length packets (block 3*b*). When write of the fixed-length packet to the NAND semiconductor memory 41 ends, the controller 30 ends the procedure.

Figure 4:
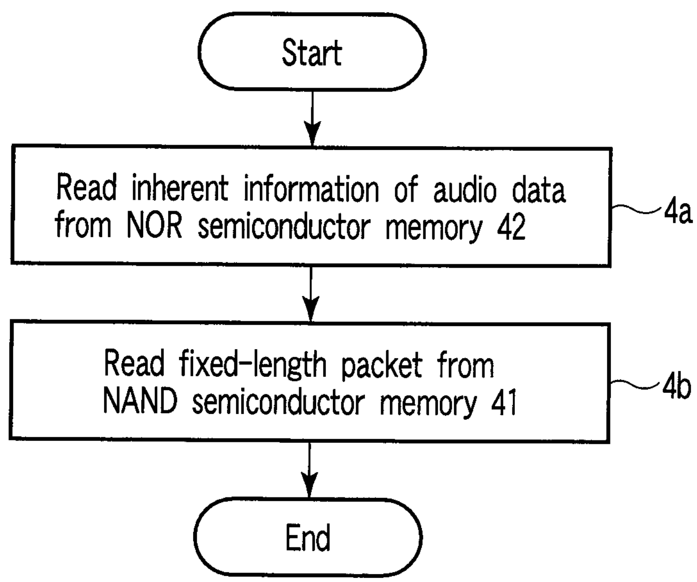
FIG. 4 is a flowchart to explain the procedure when a controller of FIG. 1 reads audio data from the storage unit.

FIG. 4 is a flowchart to explain the procedure when the controller 30 according to one embodiment of the present invention reads audio data from the storage unit 40.

The controller 30 reads inherent information of audio data from the NOR semiconductor memory 42 (block 4*a*). Then, the controller 30 refers to the inherent information to read a fixed-length packet stored in the NAND semiconductor memory 41 (block 4*b*). The read fixed-length packet is supplied to the buffer 50. When the fixed-length packet is read, the controller 30 ends the procedure.

As described above, according to this embodiment, the packetization unit 10 receives audio data comprising a plurality of variable-length frames. Then, the unit 10 packetizes the audio data storing frame data and management data in fixed-length packets for every frame. Thereafter, the storage unit 40 stores the audio data stored in fixed-length packets in the NAND semiconductor memory 41 in units of packets while stores inherent information of the audio data in the NOR semiconductor memory 42.

In this way, the semiconductor memory storage apparatus sequentially stores a packet stored with the management data in the NAND semiconductor memory 41 in fixed-length units. Thus, the semiconductor memory storage apparatus has no need to record the storage position of every frame as management data to the NOR semiconductor memory 42. In addition, the packet has a fixed length; therefore, the location where a specific frame is stored is obtained from the number of frames and the packet capacity. In other words, the quantity of management data to be recorded is less than in the conventional NOR semiconductor memory.

Further, a Reed-Solomon code is added to the tail of the fixed-length packet. Thus, this serves to compensate an error in write/read operation of the NAND semiconductor memory 41.

As a result, it is possible to reduce the storage space required for the management data in the NOR semiconductor memory. Therefore, a large amount of content data is effectively managed, so that the present invention is applicable to a semiconductor memory storage apparatus, the capacity of which is anticipated to increase in the future.

The present invention is not limited to the foregoing one embodiment. For example, according to the foregoing embodiment, the audio data is input as the content data. In this case, even if video data is input in place of the audio data, the present invention is carried out like above.

According to the foregoing embodiment, the audio data is written to a semiconductor memory. For example, a hard disk is used in place of the semiconductor memory, the present invention is carried out like above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory storage apparatus comprising:

a packetization unit configured to receive content data comprising a plurality of frame data whose data length is variable, add first management data to each of the frame data, and packetize each of the frame data and the first management data added to each of the frame data in a fixed-length packet, the first management data indicating inherent information of the frame data which includes a data size and a frame number of the frame data to which the first management data is added, wherein each fixed-length packet corresponds to a single one of the frame data, and includes the single one of the frame data and the first management data added to the single one of the frame data, each one of the frame data corresponds to a single one of the fixed-length packets, and the capacity of each fixed-length packet is equal to or greater than the sum of the capacity of each one of the frame data and the capacity of each one of the first management data;

a storage unit including a first memory configured to store the fixed-length packets and a second memory configured to store second management data, the second management data indicating inherent information of the content data which includes a number of frames of data composing the content data; and a controller configured to read the second management data stored in the second memory, read the fixed-length packets stored in the first memory based on the second management data read from the second memory, and output the read fixed-length packets.

2. The apparatus according to claim 1, further comprising:

a packet cancellation unit configured to cancel a packetization of the fixed-length packets supplied from a read buffer to generate content data comprising the plurality of frame data, and output the generated content data.

3. The apparatus according to claim 1, wherein the packetization unit inserts an error correction code to a tail of the fixed length frames.

4. The apparatus according to claim 1, wherein the first memory is a NAND semiconductor memory, and the second memory is a NOR semiconductor memory.

5. A content data management method used for a semiconductor memory storage apparatus, comprising:

receiving content data comprising a plurality of variable-length frames;

adding first management data to each frame data, the first management data indicating inherent information of the frame data which includes a data size and a frame number of the frame data;

packetizing each of the frame data and the first management data added to the each of the frame data in a fixed-length packet, wherein each fixed-length packet corresponds to a single one of the frame data, and includes the single one of the frame data and the first management data added to the single one of the frame data, each one of the frame data corresponds to a single one of the fixed-length packets, and the capacity of each fixed-length packet is equal to or greater than the sum of the capacity of each one of the frame data and the capacity of each one of the first management data;

storing the fixed-length packets and second management data in first and second memories, respectively, the second management data indicating inherent information of the content data which includes a number of frames of data composing the content data;

reading the second management data stored in the second memory;

reading the fixed-length packets stored in the first memory based on the second management data read from the second memory; and outputting the read fixed-length packets.

6. The method according to claim 5, further comprising:

canceling a packetization of the output fixed length packets to generate content data comprising the plurality of frame data, and output the generated content data.

7. The method according to claim 5, further comprising:

appending an error correction code to a tail of the fixed length packets.

* * * * *